United States Patent [19]
Muehlbauer et al.

[11] 4,291,221
[45] Sep. 22, 1981

[54] DIGITAL SEMICONDUCTOR CIRCUIT

[75] Inventors: Otto Muehlbauer, Munich; Klaus D. Bigall, Vaterstetten; Helmut Roessler, Munich, all of Fed. Rep. of Germany

[73] Assignee: Siemens Aktiengesellschaft, Berlin & Munich, Fed. Rep. of Germany

[21] Appl. No.: 48,605

[22] Filed: Jun. 14, 1979

[30] Foreign Application Priority Data

Jun. 30, 1978 [DE] Fed. Rep. of Germany ....... 2828822
Mar. 20, 1979 [DE] Fed. Rep. of Germany ....... 2910919

[51] Int. Cl.$^3$ ............................................. G06M 3/12
[52] U.S. Cl. .......................... 235/92 CC; 235/92 EC; 235/92 PE
[58] Field of Search ......... 235/92 CC, 92 PE, 92 EC, 235/92 GT, 92 LG; 307/224 R, 224 C, 221 D; 328/42

[56] References Cited

U.S. PATENT DOCUMENTS

| | | | |
|---|---|---|---|
| 3,376,410 | 4/1968 | Lundin | 235/92 PE |
| 3,548,167 | 12/1970 | Emde | 235/92 CC |
| 3,898,444 | 8/1975 | Cordi et al. | 235/92 EC |
| 4,189,635 | 2/1980 | Sheller | 235/92 EC |

*Primary Examiner*—Joseph M. Thesz
*Attorney, Agent, or Firm*—Hill, Van Santen, Steadman, Chiara & Simpson

[57] ABSTRACT

A digital semiconductor circuit has at least two circuit parts, each including a counting chain having identical memory cells which serve for receiving and transmitting digital information. The counters are controlled by a common clock. The counter of the first circuit part is coupled to a signal generator which emits a digital pulse upon reading a predetermined, specific digital state of the counter of the first part. The signal generator emits a digital pulse which is superposed on a clock pulse so as to amplitude modulate the same. The modulated clock pulse is detected by a signal recognition circuit of the second circuit part to trigger a correction signal generator which sets the counter of the second circuit part to a predetermined count.

16 Claims, 5 Drawing Figures

DIGITAL SEMICONDUCTOR CIRCUIT

BACKGROUND OF THE INVENTION

1. Field of the Invention

The present invention relates to a digital semiconductor circuit which has at least two circuit parts each including a counter constructed of identical memory cells for receiving or transmitting digital information, and more particularly to such a digital semiconductor circuit in which the counters are controlled by a common clock.

2. Description of the Prior Art

It is known in the art to utilize memory cells for constructing counters, for example, for the counters of the circuit parts mentioned above, as flip-flop cells, although other memory cells, for example, charge transfer device cells, are also possible. In the construction of the individual counters, the signal outputs of the respectively preceding cell are connected to the corresponding signal inputs of the respectively following cell, so that the binary information stored in the preceding cell is forwarded to the following cell because of the clock pulses generated by the clock, and represented by the series of equidistant binary pulses. Therefore, for example, a chain of memory cells can form a digital counter or a frequency divider or a shift register.

SUMMARY OF THE INVENTION

It is an object of the present invention to provide a digital semiconductor circuit which includes a master part and at least one slave part, in which the slave part is automatically synchronized by the master part in response to a predetermined count in the master part.

In many cases, the digital semiconductor circuit will comprise a multitude of circuit parts which are identical to one another, which are integrated on a common semiconductor chip or are distributed on a plurality of semiconductor chips which then respectively form an integrated circuit module. These are then interconnected by way of the electrodes or pins of the module according to a planned circuit diagram. Each of the circuit parts which is identical to one another is equipped with a chain of memory cells which forms a significant component portion for the actual function of the module. All of these memory cell chains and, preferably, also further component portions of the circuit are controlled by means of a common clock which, itself, can be additionally co-generated within one of the modules along with further circuits.

Above all, upon the subdivision of the semiconductor circuit into diverse integrated circuit modules, undesired shifts, caused by interference pulses, which prejudice the clock controlled cooperation of the individual circuit parts, occur between the operating performances of the individual memory chains. If, for example, it is a matter of cooperation of integrated circuit modules respectively containing a digital counter in which, for the desired function of the circuit, a specific counter reading of the counter in the first integrated circuit module is to exist with a specific counter reading of the counter in a second integrated circuit module in order to be able to realize the desired effect on the total circuit, then a discrepancy of the counter readings, by means of which the intended effect is frustrated, can occur by means of such an interference.

In addition to the effect of the clock, it would therefore be desirable to have available a further control of the digital operating conditions of the individual chains of digital memory cells in the sense of a synchronization which is controlled by one of the chains (master) and to which the chains in the remaining parts of the circuit (slaves) are then subjected. Thereby, it is also desired that this synchronization between two circuit parts be achieved with a minimum of connection paths.

A device of the type mentioned above which performs the required functions and offers additional advantages is achieved, according to the present invention, such that the chain of memory cells of a first circuit part is coupled in such a manner with a signal generator so that, when excited by attainment of a specific digital state, the signal generator emits a digital pulse to its associated chain of memory cells. The digital pulse provides an amplitude modulation of the sequence of clock pulses generated by the clock and the clock pulse so modulated is supplied to the second circuit part by way of a signal recognition circuit which responds to the modulation and triggers a correction circuit to correct the digital operating state of the chain of memory cells of the second circuit part.

Preferably, the signal generator in the first circuit part is designed in such a manner that the digital signal pulse generated exhibits the same level as the clock pulse and is synchronous therewith, so that, by means of the amplitude modulation, a pulse exhibiting an increased amplitude with respect to the remaining clock pulses appears in the sequence of the clock pulses, which pulse is employed for the correction of the adjustment of the memory cell chain in the second circuit part and, if necessary, in further circuit parts designed in accordance with the second circuit part. In the following, this pulse having the increased amplitude will be referred to as a "rider" pulse.

Upon its employment in a digital circuit of the type generally mentioned above and composed of a plurality of integrated circuit modules, for example, the invention renders possible an adjustment command (given by the rider) and the clock pulse controlling the module concerned can be transmitted by way of one and the same pin of the semiconductor module, which is true of both the master module occupying the first circuit part as well as for the second module, i.e. for a slave module occupying the second circuit part, and for further slave modules which may be present. The master module generates the adjustment pulse for the adjustment of the memory chains of the assigned slave modules and applies the adjustment pulse as a rider to the appertaining counting pulse. The slave module recognizes the rider as an adjustment command and employs the same for the synchronization of its counter or, respectively, divider or, respectively, shift register.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
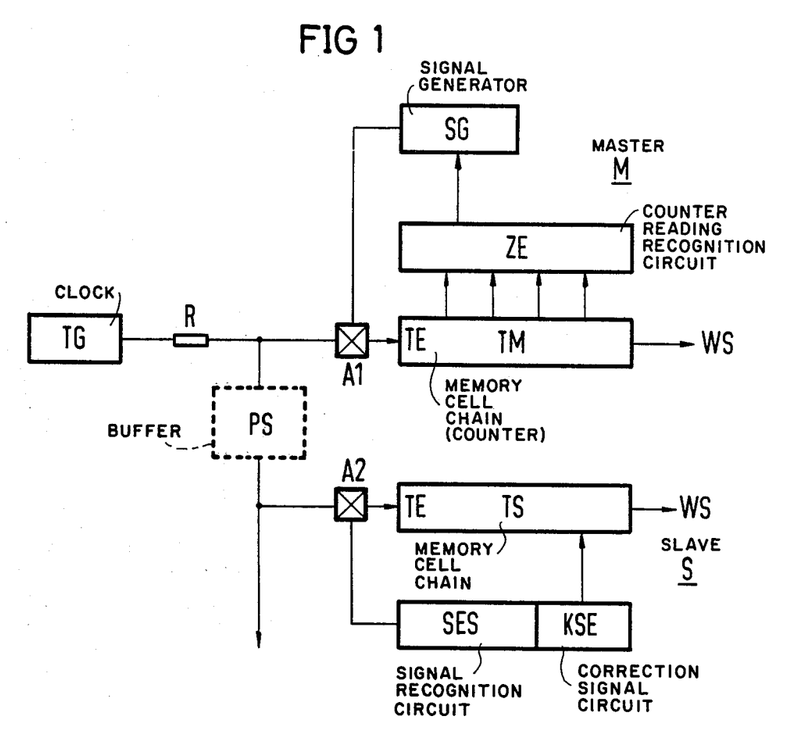
FIG. 1 is a block diagram illustrating the significant parts of a device constructed in accordance with the present invention.

Referring to FIG. 1, it is assumed that the master M and the slave S are constructed in different semiconductor crystals and, therefore, form respective integrated semiconductor modules.

In general, the master M and the slave (or slaves) S contain further circuit parts WS which, however, need not be discussed in further detail herein. Both the master, and the slaves, are supplied by a common clock TG producing clock pulses which consist of equidistant digital pulses having the levels H (high) and L (low) and which are applied to the clock pulse inputs A1 and A2 of the master M and the slave S by way of an impedance R.

The clock pulses supplied by way of the input A1 of the master module M arrives at the clock input TE of the chain TM of memory cells of the master M. The digital operating state of the chain TM is changed by one binary unit, i.e. by one bit, by means of each individual pulse of the clock. Preferably, the chain TM is constructed of n identical flip-flop cells, particularly master-slave flip-flops, connected in series, whereby signal outputs are provided after each cell so that the memory cell chain TM can be addressed as a binary digital counter—asynchronously or synchronously depending on the internal design.

The appearance of a selected operating state of the flip-flop chain TM can be determined by means of a counter reading recognition circuit ZE, likewise co-integrated in the master module, via the signal outputs of the flip-flop chain TM and, at the same time, the signal generator SG can be activated.

The operation of the arrangement is controlled via the clock TG, a rectangular pulse generator, in that the signal output of the clock TG is applied to the clock input TE of the memory cell chain TM by way of an impedance R. Both the clock TG and the impedance R can be monolithically integrated in the master module M. In the exemplary embodiment illustrated in FIGS. 1 and 3, however, this is not the case. The clock TG is a component of an external circuit whose output is applied to the electrical connection A1 of the master which is responsible for the clock pulse supplied to the master module M.

Figure 2:
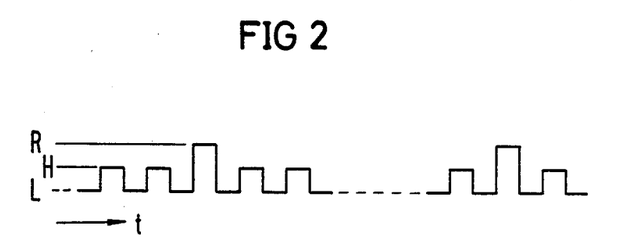
FIG. 2 is a pulse chart illustrating clock pulses, and including the rider clock pulses.

It is essential for the arrangement to be described that the signal output of the signal generator SG is also applied to the same connection A1 and a modulation of a clock pulse, in particular in the manner illustrated in FIG. 2, is achieved by superposing the primary clock pulse with the digital pulse generated by the signal generator SG to obtain the rider clock pulse.

The rider pulse now arrives at the clock input TE of the memory cell chain TM of the master module M and at the clock input TE of the memory cell chain TS of the slave module S. If, for example, the input terminal A2 is the external connection of this module for the clock pulse supplied to the slave module S, then the clock pulse signal input A1 of the master is simply conductively connected with the connection A2 of the slave module S. The rider clock pulse then arrives from the connection A2 at the clock input TE of the memory cell chain TS of the slave module and at the input of a signal recognition circuit SES which responds to the rider clock pulse.

Given the presence of a rider clock pulse, the digital operating state of the memory cell chain TS of the slave module is controlled by way of a system KSE which generates a correction signal. Thereby, a synchronization of the operating states of the memory cell chains TM and TS is preferably desired in such a manner that all memory cell chains are reset or, respectively, become reset into the digital initial state upon the occurrence of a rider clock pulse.

As set forth above, despite the common clock pulse signals for the master and the slaves, there is a danger of a loss of synchronism in the operation of the memory cell chains because of interference pulses. If, however, one provides the individual circuit parts in accordance with the present invention, the desired synchronization is automatically restored in case an undesired shift occurs between the operating states (counter readings) of the master module counter TM and the slave module counter TS.

One area of use of the present invention, for example, is provided by an electric organ whose essential circuit parts are realized by means of the interconnection digital semiconductor modules. In the sound generating system created in this manner, the frequencies of the twelve tones for the highest octave present in the organ are generated in a first module, the so-called TOP octave synthesizer, for example, by means of a high frequency distal oscillator having a subsequently connected $\sqrt[12]{2}$ divider, and the frequencies of the individual tones corresponding to the lower octaves are then generated by means of a respective series of frequency dividers assigned to the appertaining frequency of the TOP octave. Because of their high space requirements, these frequency dividers are each placed in a respective semiconductor chip, i.e. an integrated circuit module. If, however, the octave dividers of two of these modules do not run synchronously, interferences (in the extreme case, up to extinction) can arise upon the addition of the two tones of the same frequency. Therefore, synchronism must be maintained.

One can synchronize the identically constructed divider chains in that, at a favorably selected time, the divider chains are commonly adjusted to a specific state and then operation continues in accordance with the common clock. To this end, an adjustment command is required for synchronization, which command must be transmitted by way of an additional connection of the semiconductor body of the appertaining integrated circuit module. For example, for the TOP octave synthesizer to be housed in an integrated circuit module, this means twelve additional external connections which it is desirable to avoid, if only in the interest of avoiding an additional space requirement on the semiconductor chip. Moreover, each additional external connection represents a significant increase in manufacturing costs.

Figure 3:
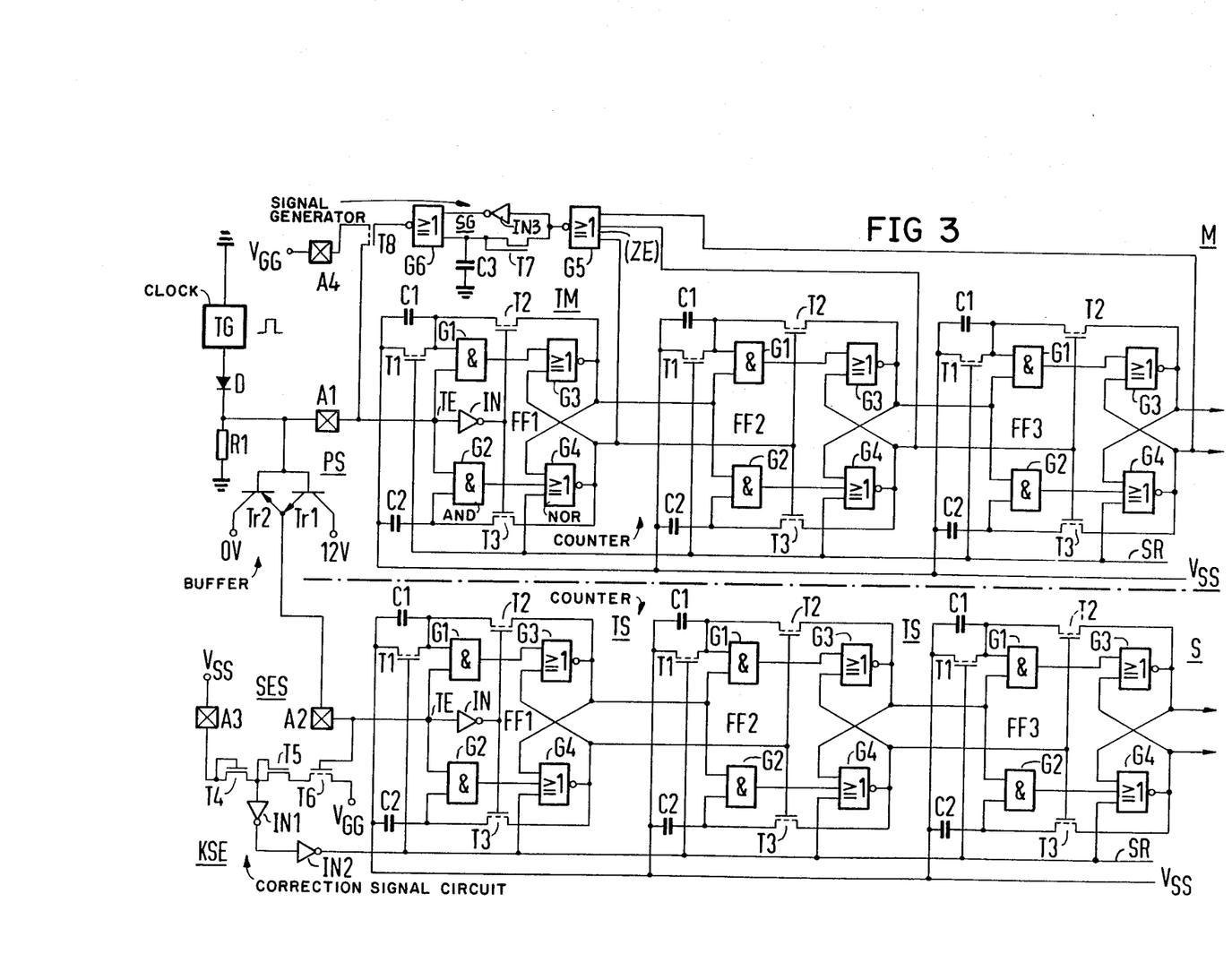
FIG. 3 is a schematic circuit diagram of a preferred embodiment of the invention.

As can be seen from FIGS. 1 and 3, in an embodiment constructed in accordance with the present invention, both the adjustment command and the clock pulse can be transmitted by way of the same connection, which holds true for the master, i.e. for the TOP octave synthesizer module, and the slaves, i.e. for the frequency divider modules. Therefore, a further advantage of the invention is provided.

The realization of the arrangement illustrated in block diagram form in FIG. 1 is possible in various ways. An advantageous exemplary embodiment is illustrated in FIG. 3.

Referring to FIG. 3, the clock TG, which is designed in a known manner as a rectangular pulse generator, has its signal output connected by way of a semiconductor diode D to a load resistor R1, to an input terminal A1 of the master module M serving for the clock pulse supply, and to an input connection A2 of each individual slave module S (only one shown) serving for the clock pulse supply, if necessary by way of a buffer circuit PS. The diode D1 has the task of decoupling the clock TG from the further circuit parts.

The electrical connection A1 of the master module M is connected to the clock input TE of the chain TM of the memory cells in the master module M. In the preferred exemplary embodiment, the memory cells are master-slave flip-flops. Their plurality n is dimensioned in accordance with the task at hand. In the example, n=3. Accordingly, in the example, the circuit part TM contains the three flip-flops FF1, FF2 and FF3. These are respectively constructed from two AND gates G1, G2, two NOR gates G3, G4 and three field effect transistors T1, T2 and T3 of the enhancement type, and two capacitors C1 and C2. The first flip-flop cell FF1 of the chain TM is an exception insofar as it also contains an inverter IN.

In the circuit illustrated in FIG. 3, the clock input TE and, therefore, the connection A1, are connected to the first signal input of the two AND gates G1 and G2, respectively having two signal inputs, and are connected by way of the inverter IN to the gate electrodes of the two transistors T1 and T2 of the first flip-flop cell FF1. The second signal input of the gate G1 is connected to the source of the transistor T2 and to the drain of the transistor T1, as well as to the first electrode of the capacitor C1. On the other hand, the second signal input of the AND gate G2 is connected to the source of the transistor T3 and to the first electrode of the capacitor C2 (but not to a transistor corresponding to the transistor T1). The second electrodes of the two capacitor C1 and C2 are connected in common to the source of the transistor T1.

The main portion of the flip-flop cell FF1 is formed by the two NOR gates G3 and G4 which are cross-coupled with one another, whereby one logical input of each of the two gates G3 and G4 is used. The NOR gate G3 has a second input and the NOR gate G4 has a second and a third input. Accordingly, the signal output of the two NOR gates G3 and G4, respectively, is connected to the first signal input of the other of these two gates. The second signal input of the gate G3 is connected with the signal output of the AND gate G1 and the second signal input of the gate G4 is connected with the signal output of the AND gate G2, whereas the third signal input of the gate G4 is connected in common with the corresponding inputs of the flip-flop cells FF2, FF3, ... FFn to a central reset signal line SR, by means of which the reset behavior of the memory chain TM is controlled. The signal output of the gate G3, further, is connected to the drain of the field effect transistor T2; and the signal output of the gate G4 is also connected to the drain of the transistor T3. Finally, the signal output for the direct signal of the flip-flop cell FF1 is provided by the signal output of the gate G3 and the signal output of the inverted signal is provided by the signal output of the NOR gate G4.

Except for the lack of the inverter IN, the following flip-flop cells FF2, FF3, ... FFn of the memory chain TM is identical with that of the flip-flop cell FF1. The signal input for the direct signal is always provided by means of the two signals inputs and of the two AND gates G1 and G2 which are accordingly connected to the signal output of the NOR gate G3 of the preceding flip-flop cell. The input for the inverted signal is provided by means of the gates of the two transistors T1 and T2 of the appertaining flip-flop cell, which are accordingly applied to the signal output of the NOR gate G4 of the respectively preceding flip-flop cell.

It should be pointed out that the construction of the chain TS of memory cells in the slave module S completely corresponds to that of the master M so that the same reference symbols are also employed for the slave module in FIG. 3.

A circuit SG is provided for generating the correction signal, i.e. the rider clock pulse, and comprises a system Z for the determination of the digital operating state of the divider TM provided for generating the rider clock pulse, the system ZE comprising a logic circuit for driving the correction signal generating circuit SG. The system ZE illustrated in FIG. 3 is designed for the desired digital operating state of the chain TM. If the operating state of the divider TM is in its initial condition "000 ... 0", then one NOR gate G5 having a plurality of logical inputs which is equal to the binary digits of the critical counter reading, preferably, therefore, the plurality of flip-flop cells FF1, FF2, ... FFn totally provided in the divider TM, suffices for the recognition of the counter reading. Then, the signal output of each flip-flop cell of the chain TM corresponding to the logic "0", i.e. the output of the gate G4, is connected to a respective input of the NOR gate G5. The NOR gate G5, therefore, delivers a logic "1" when a logic "0" is applied to each of its inputs.

The logic "1" emitted from the NOR gate G5 serves for controlling the signal generator SG which is constructed as a monoflop.

The monoflop comprises a combination of a further NOR gate G6, an inverter IN3 and a field effect transistor T7 of the depletion type connected as a resistor. The signal output of the NOR gate G5 is connected by way of the inverter IN3 to the first signal input and by way of the resistor TR7 to the second signal input of the NOR gate G6 which has two inputs and which has a signal output connected to the gate of an enhancement type field effect transistor T8. The transistor T8 is connected with its source-drain path between a terminal A4 of the master module M serving for the supply of a first reference potential $V_{GG}$ and the input connection A1 and, therefore, the source-drain path of the transistor T8 is connected with the clock input TE of the flip-flop chain TM. Finally, the field effect transistor T7 connected to the input of the NOR gate G6 as a resistor, and the appertaining input of the gate G6, are connected by way of a filter capacitor C3 to a second supply potential, particularly to ground, in the manner illustrated in FIG. 3.

Upon the occurrence of a signal at the output of the NOR gate G5, the one input of the NOR gate G6 has a logic "0" applied thereto by way of the inverter IN3, whereas a logic "0" is applied at the other input of the NOR gate G6 because of the RC time constant of the monoflop which is fixed by the capacitor C3 and the resistor T7. By so doing, a signal is triggered at the output of the NOR gate G6 to render the transistor T8 conductive and apply the potential $V_{GG}$ to the connection A1, so that a rider clock pulse is provided by superposing substantially the potential $V_{GG}$ on the clock pulse pending at the terminal A1. The RC time constant of the monoflop is of short duration in comparison to the duration of the signal at the output of the NOR gate G5. Moreover, it is not longer than and, preferably, considerably shorter than the duration of the individual clock pulse. It should also be pointed out that the chain TM in the master module M does not react to the rider clock pulse, but only to the clock pulses and the reset pulses supplied by way of the transistors T1.

A buffer circuit PS can be provided between the clock TG or, respectively, the connection A1 of the master module M and the clock pulse connections A2 of the individual slave modules S. The buffer circuit PS can be constructed in a manner illustrated in FIG. 3 in which two complementary bipolar transistors Tr1 and Tr2 are provided instead of the metal-oxide-semiconductor (MOS) field effect transistors which form the remaining circuit parts. The base of each of the bipolar transistors Tr1 and Tr2 is connected to the connection A1 of the master module M and with the signal output of the clock TG (via the diode D). The collector of the npn transistor Tr1 is connected to, for example, 12 volts, while the collector of the pnp transistor Tr2 is connected to, for example, 0 volt. The emitters of the transistors Tr1 and Tr2 are connected together and form the output of the buffer circuit PS. The object of this analog buffer PS is to achieve a capacitive coupling between the master module M and the slave modules S.

The connection A2 of the individual slave modules S is connected to the clock input TE of the chain of memory cells TS of the respective slave module S, on the one hand, and, on the other hand, to the input of the signal recognition circuit SES.

In the exemplary embodiment illustrated in FIG. 3, the chain TS of the slave coincides with the chain TM of the master which, however, is not necessary because the chain in the slave module, under certain conditions, has a different function to fulfill in that circuit than the chain TM in the master module M. Since, however, the objects of the chains TM and TS may be left out of consideration, the same construction and the same reference symbols have been employed in the embodiment illustrated in FIG. 3 for the two chains TM and TS. With respect to the chain TS, therefore, further explanations are not required, except for pointing out that the gates of the field effect transistors T1 in the individual flip-flop cells FF1, FF2, . . . FFn of the chain TS are charged by means of rider clock pulses, produced by modulation, by the master module M.

The signal recognition circuit SES represents a source follower constructed of MOS field effect transistors T4, T5 and T6 connected between two supply potentials $V_{GG}$ and $V_{SS}$, the input of the source follower being formed by means of the enhancement type transistor T6 whose gate is connected to the connection terminal A2 of the slave module S and whose drain is connected to the reference potential $V_{GG}$. The source of the input transistor T6 is connected to the depletion type transistor T5, connected as a resistor, which is connected by way of a depletion type transistor T4, also connected as a resistor, to the connection terminal A3 which has the supply potential $V_{SS}$ applied thereto. A circuit point lying between the two transistors T4 and T5 serves as the output of the source follower and is connected via two inverters IN1 and IN2 to the gates of the transistors T1 of the individual memory cells FF1, FF2, FF3, . . . FFn. The selected signal recognition circuit eliminates the capacitive load of the memory cells, whereas the two inverters IN1 and IN2 together represent a non-inverting further buffer for level regeneration.

If, in the specific circuit, the counter reading in the master module M, i.e. the operating state of the chain TM, reaches the state "000 . . . 0" triggered, for example, by SR, then all of the logical inputs of the NOR gate G5 received this state. The NOR gate G5 produces a logic "1" to activate the monoflop SG causing a digital pulse to be superposed on the arriving clock pulse to produce a rider clock pulse. The rider clock pulse effects the simultaneous resetting of the chain TS, so that the same condition is achieved as in the chain TM.

It should be pointed out that the field effect transistors of the circuit are either only n channel MOS transistors or only p channel MOS transistors, since by so doing, manufacture in monolithically integrated semiconductor technology is significantly simplified.

The embodiment just described generally operates completely satisfactorily. Occasionally, however, a situation is provided that a further chain of memory cells, particularly a second dual counter, is provided in the second circuit part, which is not continuously in operation, but rather is occasionally activated by means of a long-duration signal which is generated, for example, by means of actuation of a switch and which is to be erased at the end of the actuation and returned to a rest condition at the end of the long-duration signal. This type of circuit is of significance, for example for musical instruments which operate on an electronic basis. Here, a synchronization of the newly connected counter with the counter of the second counter already in operation is absolutely desired, which synchronization is as quick as possible. To this end, a further embodiment of the invention is described below.

According to the invention, the digital semiconductor circuit is characterized in that, in addition to the first chain of memory cells provided in the second circuit part and clock-controlled by means of the mediation of the first circuit part, a second chain of memory cells is provided in the second circuit part. In order to connect the second chain of memory cells of the second circuit part to the clock, a logic circuit, controlled by a long-duration signal and leading to the appearance of an output signal only upon a single, specific loading of the signal inputs is provided. An information transfer is triggered between the first chain of memory cells of the second circuit part and the second chain of memory cells of the second circuit part by the occurrence of the long-duration signal and by a count transfer coordinator which controls the information transfer. The count transfer coordinator is designed in such a manner that the clock pulse control of the additional chain of memory cells, hereinafter the "third counter", mediated by way of the logic circuit, begins immediately after the information transfer from the "second counter".

Preferably, the long-duration signal is triggered by means of the actuation of a switch, for example, a pushbutton, and has the duration of the respective actuation of the switch. Given the continuous operation of the total arrangement, the switch has the task of activating a third counter which was not previously involved in the operation. If the arrangement of the second and third counters is undertaken in the manner described above, it is assured that the additional chain of memory cells which constitute the third counter immediately functions synchronously with the already running second counter, i.e. before the occurrence of the next rider clock pulse.

The second and third counters are preferably designed as dual counters or dividers, so that their memory cells are provided by means of master-slave flip-flops. Details of this construction are set forth above. The logic mediating the access of the modulated clock pulse sequences supplied from the second counter to the clock input of the third counter is advantageously provided by means of an AND gate which has two signal inputs. One of these signal inputs is connected to a switch Sch which generates the long-duration signal, while the other input is connected in common with the clock input of the second counter. The output of the AND gate is connected to the clock input of the third counter.

It should be pointed out that it is not only the second counter in the second circuit part, i.e. the slave circuit part, but also the third counter of the second circuit part which is co-controlled by way of a signal recognition circuit SES which responds to the rider clock pulses and corrects the digital operating state of the counters, since the third counter at least partially assumes the control of the second circuit part during the long-duration signal. There is thereby provided an expedient possibility of employing the signal recognition circuit SES and the correction circuit KSE in common for the second and third counters of the second circuit part.

Figure 4:
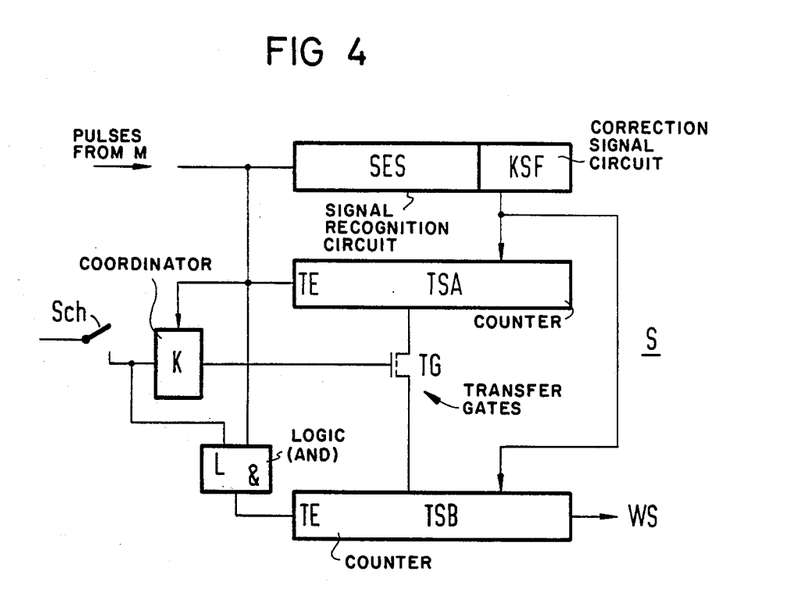
FIG. 4 illustrates another embodiment of the invention in block diagram form in which the second circuit part includes a pair of slave counters with a data transfer therebetween.

Referring to FIG. 4, the second circuit part illustrated replaces the second circuit part of FIG. 1, i.e. the slave module S. The clock pulses supplied from the first circuit part, i.e. from the master module M, are provided as set forth above in respect of FIGS. 1, 2 and 3. The standard and rider clock pulses are therefore applied to the clock input of the second counter, as in FIG. 1. The second counter is designed as a dual counter or divider and employs the clock pulses as counting pulse. It should be remembered that, as set forth above, a corresponding counter or divider is also provided in the first circuit part and is controlled by the same clock pulses for providing the modulated clock pulse sequence, that is for providing the rider clock pulse, to guarantee the synchronization of the first and second counters of the first and second circuit parts.

In addition to the first counter which is operated as set forth above and assumes its operation from the beginning upon activation of the two circuit parts, a third chain of memory cells, that is a third counter, is provided which, in contrast to the second counter, however, is connected for actuation by the actuation of a push-button, and which is then immediately to operate in synchronism with the counters discussed above, that is to have the same operating state, for example, as the second counter. If, as in the case of the second counter, the third counter is a dual counter, then the third counter should have the counter reading of the second counter immediately upon being activated and should count further with a counter reading in synchronism with the second counter, and with the first counter provided in the first circuit part. In FIG. 4, a chain of memory cells, i.e. the second counter of divider, is referenced TSA, while a chain of memory cells is referenced TSB and constitutes the third counter. The two memory chains TSA and TSB preferably have the same construction and the same number of memory cells, which are to be designed, in particular, as two memory flip-flop cells, that is master-slave flip-flops.

The assignment of the respective memory cell of the memory cell chain TSA to the corresponding memory cell of the memory cell chain TSB is respectively provided by a transfer gate TG (only one being shown) which connects the signal outputs of the appertaining memory cell of the chain TSA with the corresponding inputs of the respectively assigned memory cell of the chain TSB and which simultaneously releases the transmission path from the cells of the chain TSA to the corresponding cells of the chain TSB by means of a common transfer signal.

In general, therefore, such a connection is provided between each memory cell of the chain TSA and the respectively assigned memory cell of the chain TSB by way of at least one such MOS field effect transistor TG which has the gates thereof connected in common and controlled by a transfer coordinator K in such a manner that the information transfer from all cells occur simultaneously from the chain TSA to the cells of the chain TSB.

There is a possibility of providing that the information content of the second counter TSA is retained despite the information transfer from the second counter TSA to the third counter TSB in order to be employed for secondary, further tasks upon the control of the second circuit part S. In most cases, however, this is not necessary so that the control of further circuit parts WS belonging to the second circuit part S is provided exclusively by means of the signal output of the third counter TSB by means of the information supplied from the first circuit part and also constituting a counter or divider.

The clock pulses supplied from the first circuit part and provided with modulation, i.e. with the rider clock pulses, directly arrive at the clock input TE of the second counter TSA and, moreover, at the input of the transfer logic L, preferably represented by an AND gate having two inputs, whose second input is connected to the long-duration signal generating switch Sch, which provides, for example, by means of a dc voltage a logic "1". The delivery of the long-duration signal is also influenced by the coordinator K which provides that the first clock pulse respectively occurring after the termination of the information transfer between the second counter TSA and the third counter TSB arrives at the clock input TE of the third counter TSB regardless of whether the next clock pulse is a standard clock pulse or a rider clock pulse.

The coordinator K has the task of coordinating the information transfer from the second counter TSA into the third counter TSB, effected by means of the transfer gate TG, and triggered with the actuation of the switch Sch with the switching-on of the counting pulse at the clock input TE of the third counter TSB in such a manner that the transmission of the clock pulse control of the third counter TSB begins immediately with the termination of the transfer.

Figure 5:
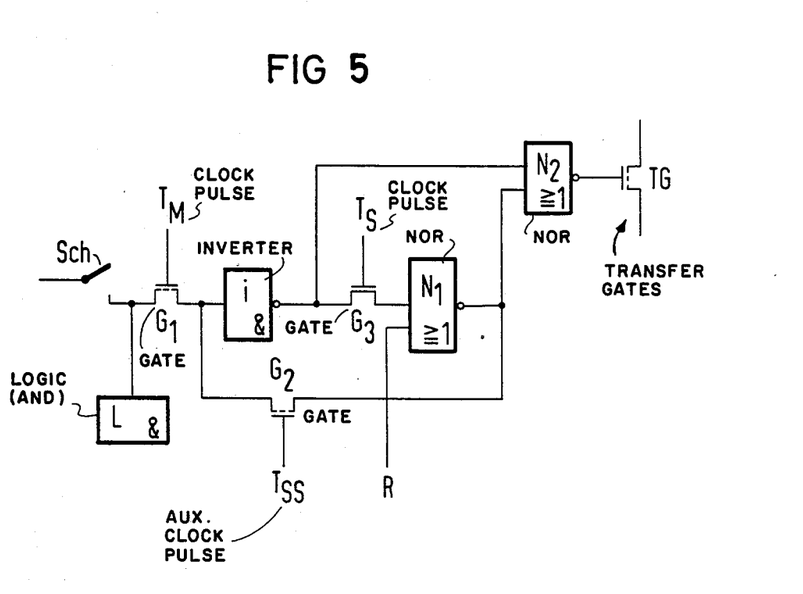
FIG. 5 is a schematic representation of a data coordinator for controlling information transfer from one counter to another.

An exemplary embodiment of a coordinator K is illustrated in FIG. 5. The potential of the long-duration signal supplied by the switch Sch is applied, on the one hand, directly at a signal input of an AND gate L and, on the other hand, by way of a gate $G_1$, controlled by a clock pulse $T_M$ and provided by means of an enhancement type field effect transistor. The long-duration signal is fed from the gate $G_1$, via a gate $G_2$ having a similar construction to the gate $G_1$ and controlled by an auxiliary clock pulse $T_{SS}$, to an input of a NOR $N_2$, whose output is connected to the gates of the information transfer transistors TG (only one shown) for controlling the transfer gates between the second counter TSA and the third counter TSB. On the other hand, the long-duration signal is fed from the gate $G_1$, via an inverter i, to another input of the NOR $N_2$.

The inverter i also feeds the long-duration signal via a third gate $G_3$, controlled by a clock pulse $T_S$, to an input of a NOR gate $N_1$, whose output is also connected to the first-mentioned input of the NOR gate $N_2$. Another input of the NOR gate $N_1$ is connected to receive a reset signal R in the same manner as the counters TSA and TSB.

Since, as already mentioned above, the individual cells of the counters TSA and TSB are designed as two-memory flip-flops, i.e. as master-slave flip-flops, two clock pulses TM and TS are required for the clock supply, of which the clock pulse TM is provided for the control of the master part and the clock pulse TS is provided for the control of the slave part of the flip-flop cells. The clock is to be equipped accordingly, for example, it can be constructed in accordance with the teachings of the German patent application No. P 28 45 379.4, since such a clock is also capable of generating the auxiliary clock pulse $T_{SS}$ at the same time.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:
1. A digital semiconductor apparatus, comprising:
    a clock for generating standard clock pulses;
    first and second pulse counters each comprising a plurality of memory cells, an input terminal connected to receive clock pulses and a plurality of outputs, each counter operable to count clock pulses applied thereto;
    signal generator means connected between said plurality of outputs of said first counter and said input terminal of said second counter and operable in response to a predetermined count to produce a digital pulse to modulate a pulse onto the clock pulse appearing at the input terminal of said second counter to provide a modulated clock pulse;
    a modulated clock pulse recognition circuit connected to said input terminal of said second counter and operable to produce a recognition signal in response to the occurrence of a modulated clock pulse; and
    a correction signal circuit connected between said modulated clock pulse recognition circuit and each of said memory cells of said second counter, and responsive to a recognition signal to set said second counter to a predetermined count.
2. The apparatus of claim 1, wherein:
    said signal generator means includes means for superposing said digital pulse on a clock pulse to produce, as a modulated pulse, a rider pulse having a magnitude greater than the standard clock pulses.
3. The apparatus of claim 1, wherein:
    said first counter and said signal generator means are constructed as a first monolithically integrated circuit; and
    said second counter, said modulated pulse recognition circuit and said correction signal circuit are constructed as a second monolithically integrated circuit.
4. The apparatus of claim 1, wherein said signal generator means comprises:
    a counter reading circuit connected to said outputs of said first counter; and
    a pulse generator connected to and operated by said counter reading circuit.
5. The apparatus of claim 4, wherein:
    said counter reading circuit includes means responsive to the initial state of said first counter to trigger said pulse generator.
6. The apparatus of claim 1, comprising:
    a buffer circuit connected between said clock and said input terminal of said second counter to capacitively decouple said input terminals of said first and second counter.
7. The apparatus of claim 1, wherein:
    each of said memory cells is a master-slave memory cell.
8. The apparatus of claim 1, wherein said signal generator means comprises:
    a NOR gate including a plurality of inputs connected to said plurality of outputs of said first counter, and an output;
    a monoflop including an input connected to said output of said NOR gate, an output, and activated by said NOR gate to produce an output pulse; and
    a field effect transistor including a source-drain path connected between a suppy potential and said input of said first counter, and a gate connected to and controlled by said output of said monoflop.
9. The apparatus of claim 1, wherein said modulated clock pulse recognition circuit comprises:
    a plurality of source-follower connected field effect transistors having serially-connected source-drain paths connected between a pair of supply potentials, one of said field effect transistors including a gate connected to said input terminal of said second counter, the others of said field effect transistors including respective gates connected to the respective sources, and an output formed at the drain-source connection of two of said transistors.
10. The apparatus of claim 9, wherein said correction signal circuit comprises:
    inverter means connected between said output of said modulated clock pulse recognition circuit and each of said memory cells of said second counter.
11. The apparatus of claim 10, wherein said inverter means comprises:
    a pair of serially-connected inverters.
12. The apparatus of claim 1, comprising:
    a third pulse counter including an input terminal and a plurality of memory cells each of which is connected to said correction signal circuit and set thereby to a predetermined count;
    count transfer means connected between said memory cells of said second and third counters; and
    count transfer control means including a logic circuit and a data coordinator, said logic circuit having an output connected to said input terminal of said third counter, a first input connected in common with said input terminal of said second counter, and a second input for receiving an enabling signal, said logic circuit operable in response to a control signal and clock pulses to operate said third counter;

means for producing a control signal connected to said second input of said logic circuit; and said data coordinator including a first input connected in common with said input terminal of said second counter to receive clock pulses, a second input connected to said means for producing a control signal, and an output connected to said count transfer means, and operable in response to the control signal and a clock pulse to operate said count transfer means and transfer the count of said second counter into said third counter.

13. The apparatus of claim 12, wherein said logic circuit comprises:

an AND gate.

14. The apparatus of claim 12, wherein said means for producing a control signal comprises:

a switch connected between said first input of said logic circuit and a supply potential.

15. A method of synchronizing two counters driven by the same clock each of which have a plurality of counting stages and each operable to count clock pulses, comprising the steps of:

monitoring the count of a first of the counters;

producing a digital pulse in response to a predetermined count of the monitored counter;

modulating a clock pulse with said digital pulse;

triggering a correction signal in resonse to said modulated clock pulse; and applying the correction signal to the second counter to set the same to a predetermined count.

16. The method of claim 15, comprising the steps of:

transferring the count of the second counter to a third counter; and simultaneously operating the third counter at the rate of the second counter.

* * * * *